US012572728B2

(12) United States Patent
Li et al.

(10) Patent No.: US 12,572,728 B2
(45) Date of Patent: Mar. 10, 2026

(54) ELECTROSTATICS-BASED GLOBAL PLACEMENT OF CIRCUIT DESIGNS HAVING OVERLAPPING REGION CONSTRAINTS

(71) Applicant: Xilinx, Inc., San Jose, CA (US)

(72) Inventors: Wuxi Li, San Bruno, CA (US); Mehrdad Eslami Dehkordi, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 520 days.

(21) Appl. No.: 18/105,605

(22) Filed: Feb. 3, 2023

(65) Prior Publication Data

US 2024/0265182 A1     Aug. 8, 2024

(51) Int. Cl.
*G06F 30/30* (2020.01)
*G06F 30/392* (2020.01)
*G06F 30/398* (2020.01)

(52) U.S. Cl.
CPC .......... *G06F 30/392* (2020.01); *G06F 30/398* (2020.01)

(58) Field of Classification Search
CPC .............................. G06F 30/392; G06F 30/398
See application file for complete search history.

(56) References Cited

U.S. PATENT DOCUMENTS 5,682,322 A * 10/1997 Boyle ................... G06F 30/392
716/135

OTHER PUBLICATIONS

Jingwei Lu, et al., "Electrostatics based Placement using Fast Fourier Transform and Nesterov's Method", ACM Transactions on Embedded Computing Systems, vol. V, No. N, Article A, downloaded Jan. 23, 2003.
Jingwei Lu, et al., "elfPlace: Electrostatics-based Placement for Large-Scale Heterogeneous FPGAs", downloaded Jan. 6, 2003.
Yibo Lin, et al. "DREAMPlace: Deep Learning Toolkit-Enabled GPU Acceleration for Modern VLSI Placement", DAC 19, Jun. 2-6, 2019, © 2019 Association for Computing Machinery, Las Vegas, NV, USA.
Lixin Liu, et al., "Xplace: An Extremely Fast and Extensible Global Placement Framework", DAC '22, Jul. 10-14, 2022, © 2022 Association for Computing Machinery, San Francisco, CA, USA.
(Continued)

*Primary Examiner* — Jack Chiang
*Assistant Examiner* — Brandon Bowers
(74) *Attorney, Agent, or Firm* — Patterson + Sheridan, LLP

(57) ABSTRACT

Globally placing a circuit design includes adjusting indicated capacity levels for placement bins associated with a target integrated circuit, based on first levels of demand for resources by instances in the circuit design in regions of the target IC. Region constraints restrict placement of the instances in the regions, and the regions include two or more two or more overlapping regions. Tracked levels of demand for resources in the placement bins are adjusted, after adjusting the indicated capacity levels, based on the indicated capacity levels, a target utilization level of the resources in the placement bins, and a current placement. The current placement of the instances is updated based on a density gradient of an electrostatics-based model of the tracked levels of demand, and repeating adjusting the tracked levels of demand and updating the current placement are repeated in response to the density gradient failing to satisfy a threshold.

20 Claims, 6 Drawing Sheets

(56)         References Cited

OTHER PUBLICATIONS

Jiaqi Gu, et al., "DREAMPlace 3.0: Multi-Electrostatics Based Robust VLSI Placement with Region Constraints", ICCAD '20, Nov. 2-5, 2020, © 2020 Association for Computing Machinery, Virtual Event, USA.

Wenxing Zhu, et al., "Analytical Solution of Poisson's Equation and Its Application to VLSI Global Placement", ICCAD '18, Nov. 5-8, 2018, © 2018 Association for Computing Machinery, San Diego, CA, USA.

Chau-Chin Huang, et al., "NTUplace4dr: A Detailed-Routing-Driven Placer for Mixed-Size Circuit Designs With Technology and Region Constraints", IEEE Transactions on Computer-Aided Design of Integrated Circuits and Systems, vol. 37, No. 3, Mar. 2018, (C) 2017 IEEE.

* cited by examiner

ELECTROSTATICS-BASED GLOBAL PLACEMENT OF CIRCUIT DESIGNS HAVING OVERLAPPING REGION CONSTRAINTS

TECHNICAL FIELD

The disclosure generally relates to electrostatics-based global placement of circuit designs having overlapping region constraints.

BACKGROUND

Placement is an integral step in realizing a circuit implementation from a circuit design. Recently, electrostatics-based non-linear global placement approaches, such as "ePlace," have yielded high quality solutions and good scalability. However, electrostatics-based placement has had limited success when applied to complex region constraints commonly found in commercial designs.

SUMMARY

A disclosed method includes adjusting indicated capacity levels for placement bins associated with a target integrated circuit (IC) by a design tool, based on first levels of demand for resources by instances in a circuit design in regions of the target IC. The regions are specified in the circuit design by a plurality of region constraints that restrict placement of the instances in the regions, and the regions include two or more overlapping regions. The method includes adjusting tracked levels of demand for resources in the placement bins by the design tool, after adjusting the indicated capacity levels, based on the indicated capacity levels, a target utilization level of the resources in the placement bins, and a current placement of the instances in the placement bins. The method includes updating the current placement of the instances by the design tool based on a density gradient of an electrostatics-based model of the tracked levels of demand. The method includes repeating adjusting the tracked levels of demand and updating the current placement in response to the density gradient failing to satisfy a threshold.

A disclosed system includes one or more computer processors configured to execute program code and a memory arrangement coupled to the one or more computer processors. The memory arrangement is configured with instructions of a design tool that when executed by the one or more computer processors cause the one or more computer processors to perform operations that includes adjusting indicated capacity levels for placement bins associated with a target integrated circuit (IC), based on first levels of demand for resources by instances in a circuit design in regions of the target IC. The regions are specified in the circuit design by a plurality of region constraints that restrict placement of the instances in the regions, and the regions include two or more overlapping regions. The operations include adjusting tracked levels of demand for resources in the placement bins, after adjusting the indicated capacity levels, based on the indicated capacity levels, a target utilization level of the resources in the placement bins, and a current placement of the instances in the placement bins. The operations include updating the current placement of the instances based on a density gradient of an electrostatics-based model of the tracked levels of demand, and repeating adjusting the tracked levels of demand and updating the current placement in response to the density gradient failing to satisfy a threshold.

Other features will be recognized from consideration of the Detailed Description and Claims, which follow.

BRIEF DESCRIPTION OF THE DRAWINGS

Various aspects and features of the methods and systems will become apparent upon review of the following detailed description and upon reference to the drawings in which.

DETAILED DESCRIPTION

Figure 1:
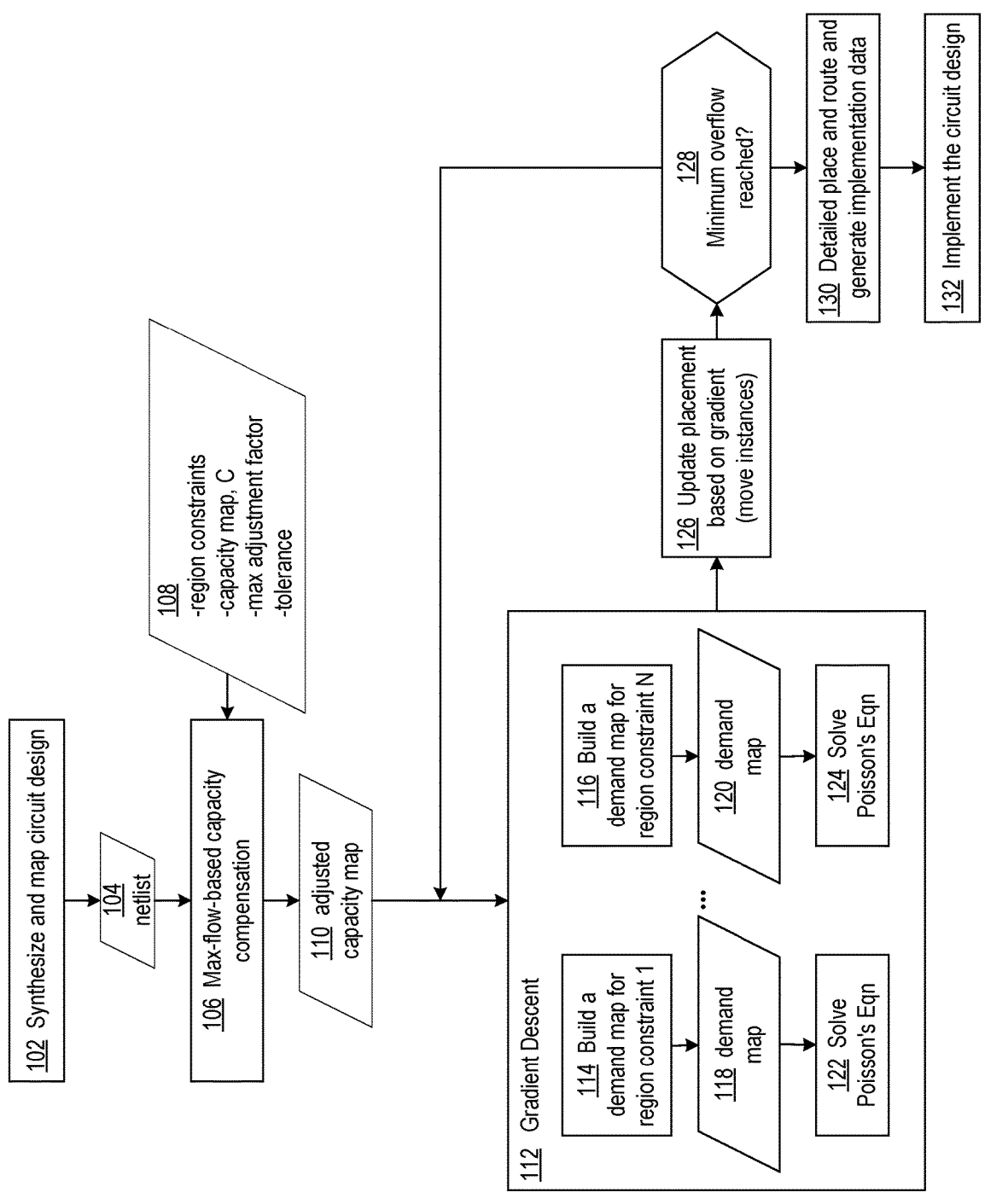
FIG. 1 shows a flowchart of an exemplary design flow in which the disclosed approaches are used in placing a circuit design having overlapping region constraints.

In the following description, numerous specific details are set forth to describe specific examples presented herein. It should be apparent, however, to one skilled in the art, that one or more other examples and/or variations of these examples may be practiced without all the specific details given below. In other examples, well known features have not been described in detail so as not to obscure the description of the examples herein. For ease of illustration, the same reference numerals may be used in different diagrams to refer to the same elements or additional instances of the same element.

A region constraint can be specified by a circuit designer to restrict instances in a circuit design to be placed within certain physical areas of a target IC. An "instance" in a circuit design refers to an element that can be placed on a circuit resource at a particular location on the target IC. The circuit resources include combinational logic circuits, flip-flops, nodes, memory blocks, etc. For target ICs such as field programmable gate arrays, the placement processes of a design tool rely on region constraints to ensure a legal placement, expedite convergence to a solution, and improve the quality of results. Examples of region constraints include clock region constraints that restrict the span of clock loads due to limited clock routing resources; pre-allocated dynamic regions in partial reconfigurable flow; and user-defined region constraints for customized or hierarchical design flows.

Current electrostatics-based non-linear global placement approaches have given limited attention handling region constraints, which limits applicability to complex designs. The disclosed electrostatics-based non-linear global placement approaches provide a comprehensive placement scheme that supports all possible region constraint scenarios in real designs.

According to the disclosed approaches involving electrostatics-based non-linear global placement, a design tool compensates for capacity shortfalls, relative to levels of demand for resources by overlapping region constraints, by adding virtual capacity to the actual capacity of the target IC in order to provide an adjusted capacity level for achieving global electrostatic equilibrium. The design tool creates a separate electrostatics-based model for each region constraint based on the adjusted capacity level, a target utilization level, and the levels of demand for resources within an area that bounds a constrained region defined by the region constraint. Based on a density gradient of the electrostatics-based models, the design tool adjusts placement of the instances.

FIG. 1 shows a flowchart of an exemplary design flow in which the disclosed approaches are used in placing a circuit design having overlapping region constraints. At block 102, a design tool synthesizes and maps a circuit design to elements of a target integrated circuit (IC). The target IC can be an application specific integrated circuit (ASIC), a field programmable gate array (FPGA), or a system-on-chip (SoC) or system-in-package (SiP) that includes either or both ASIC and FPGA circuitry. The resulting netlist 104 is input to a max-flow-based capacity compensation (MFCC) process 106.

The MFCC process 106 adjusts the capacity level of the target IC to include a virtual capacity along with the actual capacity so that the electrostatic equilibrium is achievable even if region constraints are ill-formed. Ill-formed region constraints are those in which the constraints overlap and a target utilization rate cannot be achieved, because the overlapping area would not support the target utilization rate.

Along with the netlist 104, the MFCC process 106 inputs data 108 to be used in adjusting the capacity level of the target IC. The data include region constraints, an initial capacity map, "C," a maximum adjustment factor, and a tolerance level. As indicated above, a region constraint restricts instances in the circuit design to placement within certain physical areas of the target IC. A region constraint defines a single or a set of adjacent rectangular areas that a given set of instances must be placed into. A region constraint can be either inclusive or exclusive. An inclusive region constraint allows placement of the specified instances and instances not specified in the region constraint. An exclusive region constraint allows placement of only those instance specified by the region constraint. Inclusive region constraints can, but exclusive region constraints cannot, specify overlapping regions. However, an exclusive region constraint can specify a region that overlaps with or is wholly contained within the region of an inclusive region constraint. Instances in an inclusive region constraint cannot be placed in an area of an exclusive region constraint that overlaps the inclusive region constraint.

The capacity map indicates capacity levels of placement bins on the target IC. A placement bin is a rectangular area of the target IC in which instances in the circuit design might be placed. A placement bin has a capacity level for each different type of instance. The maximum adjustment factor controls an upper limit of the virtual capacity that can be added to the actual capacity level.

The tolerance is a numeric value used by the MFCC process to determine whether or not a rectangular set of placement bins (e.g., "sub-region", see FIG. 2) is over-utilized. The design tool determines that a sub-region is over-utilized in response to the demand for resources by instances specified in overlapping region constraints exceeding a target utilization level of the resources available (capacity level), less the tolerance level, in the sub-region. The tolerance is also used to stop the iterative MFCC process once a solution having a desired level of accuracy is found.

The MFCC process produces an adjusted capacity map in which virtual capacity levels are added to the initial capacity levels of the placement bins that are part of over-utilized sub-regions. The adjusted capacity map is input to gradient descent process 112, which is iteratively performed to determine an amount by which to spread the placement of instances in the circuit design based on the density gradient of the electrostatics-based demand model, in combination with gradients of wirelength and timing models (not shown for simplicity).

The gradient descent process 112 generates and evaluates respective electrostatics-based models for the region constraints associated with the circuit design based on the adjusted capacity map 110 and demand maps generated for the region constraints. At blocks 114, . . . , 116, the gradient descent process builds N demand maps 118, . . . , 120 corresponding to N region constraints. In building the demand maps, levels of virtual demand are added to account for interdependencies among overlapping region constraints. Each demand map indicates levels of demand by a current placement for resources on placement bins within a bounding box (i.e., a rectangular area encompassing a set of placement bins) that contains the region of the region constraint. The virtual demand can be added by creating filler instances and placing the filler instances. A filler instance is an instance that is not connected to any other instance in the circuit design but has a size from which a level of demand can be added to the level of demand on a placement bin. The filler instances can have the same size, which can be user-defined or based on statistics (e.g., a mean or median) of sizes of actual instances.

The solution of each electrostatics-based model is given by Poisson's equation, which correlates electric potential $\psi$, electric field $\xi$, and charge density $\rho$ in a region R. Poisson's equation can be efficiently solved by spectral methods using 2D discrete Fourier transform (DFT), for example. At blocks 122, . . . , 124 the design tool solves Poisson's equation for the electrostatics-based models of the region constraints.

At block 126, the design tool updates the placement based on the density gradients determined from the electrostatics-based models and the wirelength and timing gradients. Within each region defined by a region constraint, the design tool moves instances in the circuit design based on the density gradient determined from solving Poisson's equation for the corresponding electrostatics-based model, along with globally determined wirelength and timing gradients based on the current placement. The distances by which the instances are moved can be a product of a step size and the magnitude of the gradient(s). The step size can be automatically generated by gradient descent logic of the design tool. The computed density gradient can be a pair of real numbers that indicate the direction to move the instances in a region constraint. The first number indicates a value for horizontal movement, and the second number indicates a value for vertical movement. A positive first number indicates movement to the right, and a negative first number indicates movement to the left. A positive second number indicates an upward movement, and a negative second number indicates a downward movement. For example, movement rightward and downward can be indicated by the numbers (3.231 and −1.523).

In moving instances, each instance is assigned x-y coordinates relative to the area of the target IC, and the demand map is updated to indicate the level of demand by instances whose placement is within or overlaps each placement bin. Each instance (both actual and filler) defines a rectangular area, and in global placement instances are permitted to overlap multiple placement bins. Resolving the placement of an instance completely within a placement bin, such as placements involving FPGAs, is handled by the detailed placement processes (block 130) of the design tool. The level of demand of an instance whose placement overlaps multiple placement bins is divided amongst those placement bins in proportion to the portion of the area of the instance overlapping the placement bins.

At decision block 128, the design tool determines whether or not a minimum threshold level overflow has been reached. The level of overflow can be a ratio of demand overflow to the total level of demand, where the demand overflow at each bin can be defined by bin_demand− bin_capacity*target utilization (bin_demand is the level of demand by instances placed in the bin and bin_capacity is the capacity level of resources of the bin). In response to the ratio being less than (or equal to) the threshold value, the design tool can proceed to block 130. Otherwise, the design tool performs another iteration of the gradient descent process.

At block 130, the design tool deletes the filler instances and performs detailed placement and routing of the actual instances in the circuit design and generates implementation data. For example, place-and-route and bitstream generation tools may be executed to generate configuration data for an FPGA. Other tools can generate configuration data from which an application-specific (ASIC) can be fabricated. At block 132, a circuit can be implemented by way of config- uring a programmable IC with the configuration data or fabricating, making, or producing an ASIC from the con- figuration data, thereby creating a circuit that operates according to the resulting circuit design.

An electrostatics-based system always seeks a global equilibrium of charge density. That is, the convergence happens where the charge density is evenly distributed everywhere. Electrostatics-based placers rely on this prop- erty to enforce the placement legality. However, if the region constraints are ill-formed, such equilibrium may not be reachable. For example, instances in region constraints that create a utilization greater than the target utilization would be pushed to the boundaries of the region and lead to a halo effect. If all region constraints are non-overlapping, this issue can be resolved by creating a separate and independent electrostatic system for each of them. However, overlapping region constraints make finding a placement solution non- trivial.

The MFCC algorithm resolves the complexities associ- ated with placing instances specified in overlapping region constraints. Generally, the MFCC algorithm identifies non- overlapping sub-regions formed by the overlapping region constraints and determines which sub-regions are over- utilized by evaluating the maximum flow ("max-flow") through a bipartite graph of the demands of region con- straints and capacities of the sub-regions. The MFCC pro- cess artificially increases the local target utilization of over- utilized sub-regions by adding virtual capacity to make the global equilibrium achievable. The MFCC algorithm can be applied to a region constraint that does not overlap with any other region constraints, because a non-overlapping region constraint can also have a utilization greater than the target utilization. However, alternative compensation approaches may be more suitable. The MFCC process is explained by way of an example shown in FIGS. 2 and 3 and the MFCC algorithm accompanying the description of FIG. 3.

Figures 2, 3:
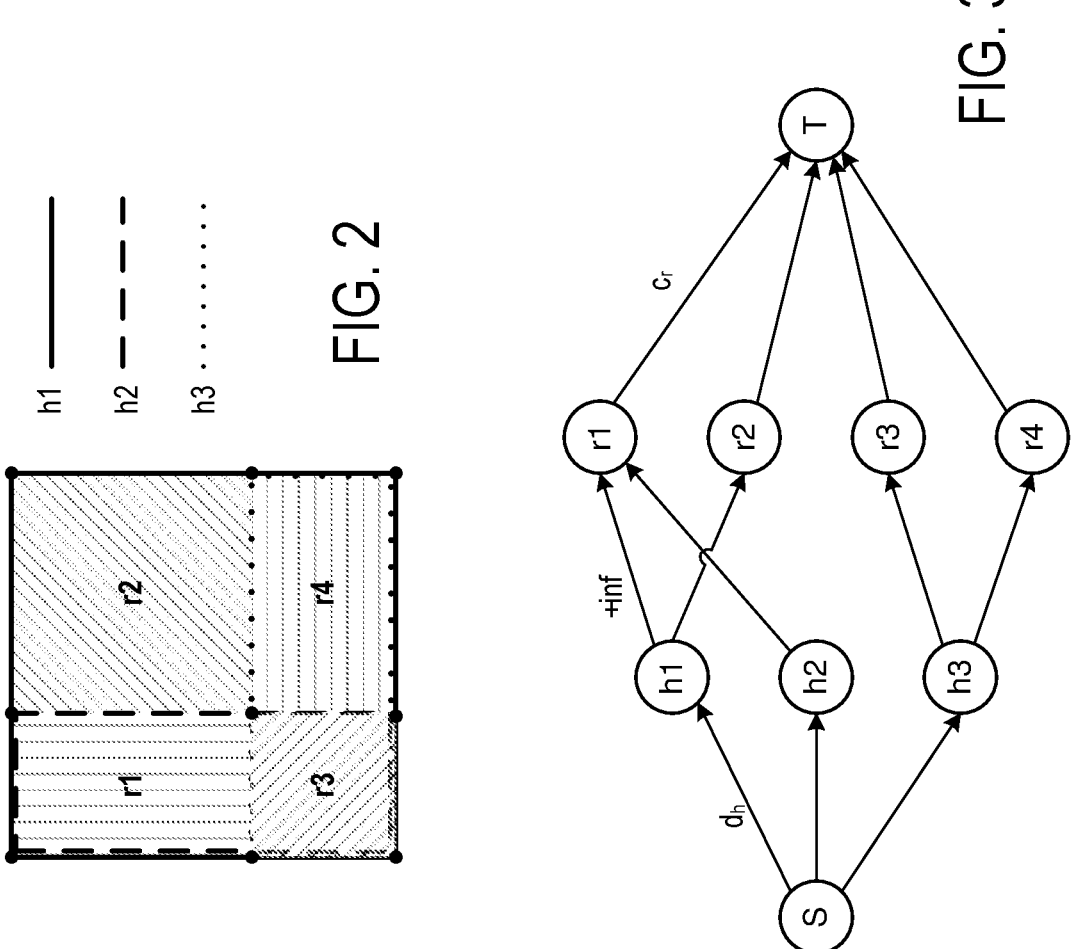
FIG. 2 shows an example of three overlapping region constraints and the sub-regions identified by the max-flow capacity compensation (MFCC) process.
FIG. 3 shows a bipartite graph generated from the example of FIG. 2.

FIG. 2 shows an example of three overlapping region constraints and the sub-regions identified by the MFCC process. The levels of resource demand by the region constraints and the resource capacities of the sub-regions are used to determine the amount of virtual capacity to add to the capacity map.

The region constraints are identified as "h1," "h2," and "h3." Region constraints h1 and h2 are inclusive, and region constraint h3 is exclusive. The boundary of region constraint h1 is shown by a solid line, the boundary of region constraint h2 is shown by a dashed line, and the boundary of region constraint h3 is shown by a dotted line. Boundaries of region constraints that overlap are shown as being slightly offset in order to clearly illustrate the boundaries of each region constraint.

The example shows rectangular regions and has region constraints h2 and h3 defining regions that are wholly contained within the region defined by region constraint h1. It will be recognized, however, that the MFCC process is applicable to non-rectangular regions that are equiangular (90 degrees) polygons and to overlapping regions that are not wholly contained within the region of one of the region constraints.

The MFCC process identifies sub-regions from lines that connect the rectilinear corners of the regions and intersec- tions of lines that connect the rectilinear corners. The rectilinear corners and intersections are shown as solid circles in FIG. 2 In the example, regions of h1, h2, and h3 form sub-regions r1, r2, r3, and r4.

FIG. 3 shows a bipartite graph generated from the example of FIG. 2. Vertices labeled h1, h2, and h3 corre- spond to the region constraints h1, h2, and h3 of FIG. 2, and vertices labeled r1, r2, r3, and r4 correspond to the sub- regions r1, r2, r3, and r4 of FIG. 2.

For a set of region constraints, H, and sub-regions, R, the bipartite graph has for all region constraints h∈H, vertices corresponding to the region constraints on the left and for all sub-regions r∈R vertices corresponding to the sub-regions on the right. The MFCC process creates an edge from h∈H to r∈R if an instance in the region constraint can be placed in the sub-region. Valid edges are (h1, r1), (h1, r2), (h2, r1), (h3, r3), and (h3, r4). An instance in region constraint h1 cannot be assigned to sub-region r3 or r4, because only cells of exclusive region constraint h3 can be assigned to r3 and r4.

To compute max-flow, the source vertex S is connected by edges to each h∈H, and the target vertex T is connected by edges to each r∈R. Edge capacities ("labels") are associated with the edges to represent flow capacities, which are based on levels of demand and capacity levels areas of the target IC. The edge capacity of an edge from the source vertex S to a region-constraint vertex, which is denoted $d_h$, indicates the level of demand for resources by instances in the region constraint. The edge capacity of an edge from a sub-region vertex to the target vertex T, which is denoted $c_r$, indicates the total resource capacity level of the sub-region. The edge capacity of an edge from a region-constraint vertex to a sub-region vertex can be a very large number, denoted +inf, or the level of demand, $d_h$, of the region constraint.

Pseudo-code that describes the MFCC algorithm is shown in the Algorithm below. The inputs to the MFCC algorithm include the total resource demand, D, the region constraints, resource capacity map, C; a maximum capacity-increasing factor $\tau_{max}$, and a numeric tolerance $\epsilon$. The output of the

7

MFCC algorithm is an adjusted capacity map, C'=C+ΔC, such that the global equilibrium is achievable if C' is used as the capacity map.

Algorithm

1 Divide the layout into regions R in the sub-region grid defined by all rectilinear corners in h ∈ H, and make bipartite graph having initial edge capacities, c
2 $f_0$ ← max-flow(c);
3 if $f_0$ == D then
4 return (C);
5 $t_r$ ← 0, ∀r ∈ R;
6 for each r ∈ R do
7 if max-flow ($c_1$, . . . , $C_r$ – $\epsilon$, . . . , c|R|) < $f_0$ then
8 $t_r$ ← 1;
9 $\tau_l$ ← 0;
10 $\tau_h$ ← $Z_{max}$;
11 $f_l$ ← $f_0$;
12 $f_h$ ← max-flow(c + $\tau_h$ ⊙ t ⊙ c);
13 while $f_h$ – $f_l$ > $\epsilon$ do
14 $\tau$ = 0.5($\tau_l$+ $\tau_h$);
15 f← max-flow(c + τ⊙ t ⊙ c);
16 if f ← $f_h$ then
17 $f_l$←f
18 $\tau_l$←τ,
19 else
20 $\tau_h$ ← τ;
21 Set ΔC by distributing: $\tau_l$ $t_r c_r$ to bins in r, ∀r ∈ R;
22 return (C+ ΔC)

In line 1, the MFCC algorithm divides the layout into a set of non-overlapping rectangular sub-regions, R, based on the grid defined by the rectilinear corners of all region constraints h∈H. In line 2, the MFCC algorithm solves max-flow of the graph having initial capacities, c, which can be a vector of values indicating the edge capacities of the edges. The computed max-flow indicates the maximum demand that can be handled by the capacity limitations of the regions. In lines 3-4, if the computed initial max-flow, f0, is equal to the total resource demand, D, of all instances, then there are no over-utilized regions needing compensation, and the input capacity map is returned. The design tool creates separate graphs for the different types of instances, and the total resource demand is the demand for the type of resource required by that type instance.

If f0 is less than the total resource demand, in lines 5-8, the MFCC algorithm determines which sub-regions are causing the over-utilization. Generally, the MFCC algorithm individually perturbs each capacity $c_r$, r∈R, by the tolerance, ε, and checks whether max-flow is reduced to less than the initial max-flow, f0. If the new max-flow is less than the initial max-flow, the corresponding element of t is set to 1 to indicate that the associated sub-region is causing over-utilization.

For those bottleneck sub-regions (i.e., $t_r$=1) the MFCC algorithm performs a binary search to find the minimum capacity-increasing factor τ such that the maximum max-flow value can be achieved. In lines 9-20, the MFCC algorithm iteratively solves max-flow with increased region capacity c+τ⊙t⊙c (⊙ denotes element-wise multiplication) until a predefined numeric tolerance ε is met.

The tolerance is used to stop the iterative process in response to achieving a solution having a desired level of accuracy. For example, if the initial flow gap ($f_h$–$f_l$) is 0.2, this gap can gradually converge to 0 in iterating the while loop. The gap may change as follows: 0.2, 0.1, 0.1, 0.03, 0.02, 0.02, 0.0001, . . . . In practice, the difference between a flow gap of 0.0001 and 0.000000001 may be inconsequential, and the tolerance could be set to 0.0001 to limit iterations.

In line 21, the MFCC algorithm computes the final capacity compensation map, ΔC, by evenly distributing $\tau_l c_r$ in each r∈R. That is, for each sub-region determined to cause the over-utilization (from lines 6-8), $\tau_l c_r$ is divided evenly amongst the placement bins that form the sub-region r, and the MFCC algorithm updates the entries corresponding to those placement bins in the capacity compensation map. For an over-utilized sub-region r, covered by n placement bins, the entries in the capacity compensation map corresponding to the n placement bins are updated with the value, $\tau_l c_r$/n, which is virtual capacity added to the placement bins. By using C+ΔC, instead of C, as the resource capacity map, global electrostatic equilibrium is achievable.

Figure 4:
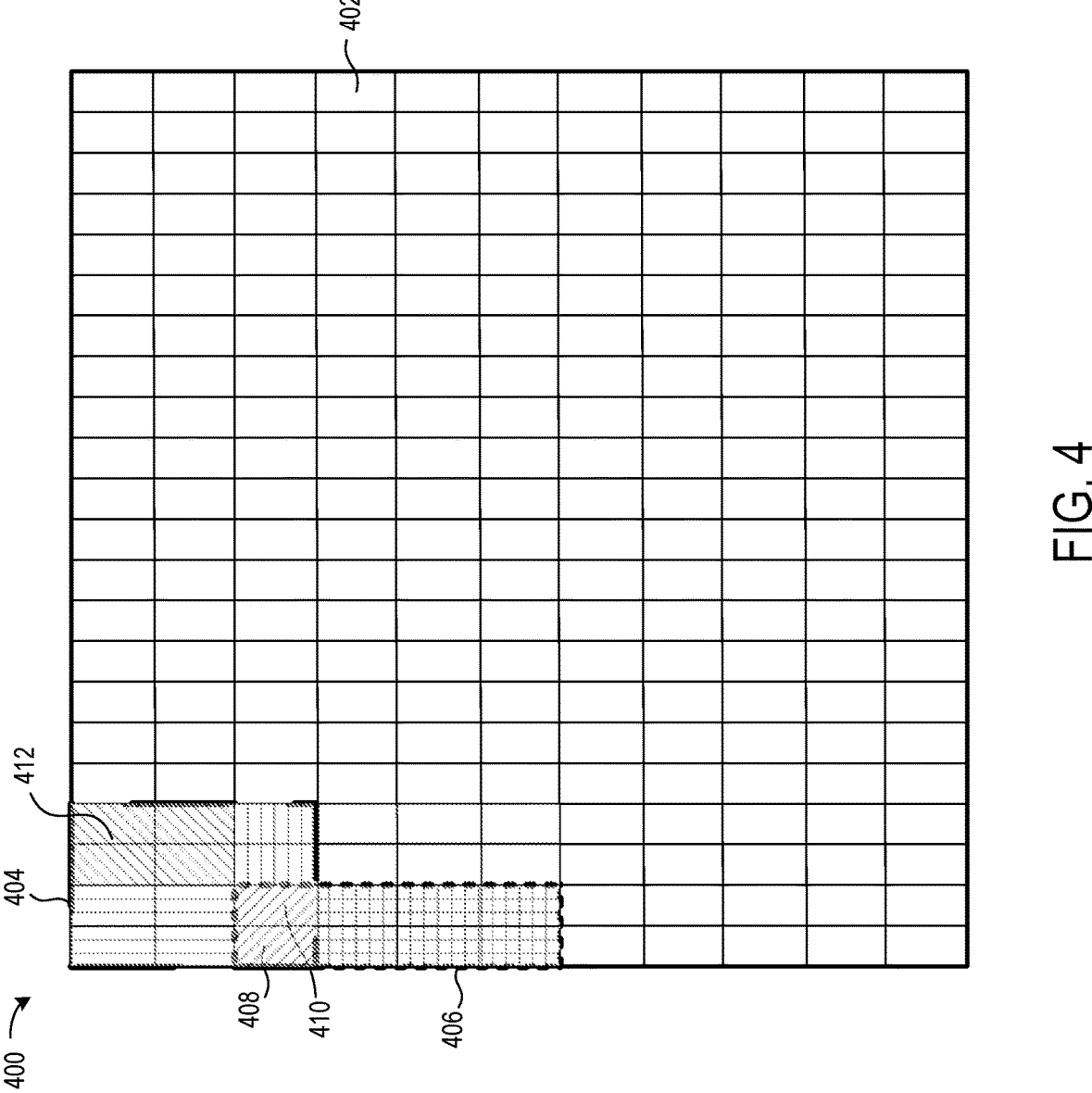
FIG. 4 shows an exemplary capacity map in which two regions of the integrated circuit defined by two region constraints overlap.

FIG. 4 shows an exemplary capacity map in which two regions of the integrated circuit defined by two region constraints overlap. The capacity map 400 has entries corresponding to the placement bins of the target IC, and the illustrated positions of the entries in the capacity map correspond to the physical locations of the placement bins on the target IC. Each entry is illustrated as a rectangular block and represents an area of the target IC. For example, block 402 illustrates one entry in the capacity map.

Each entry in the capacity map can indicate the capacity level, such as the number of instances, of a type of instance that can be implemented by the circuit resources in that placement bin. To handle multiple types of instances, each entry in the capacity map can have multiple values corresponding to the types of instances. Alternatively, separate capacity maps can be maintained for the different types of instances.

The two overlapping regions covered by the two region constraints in the example are shown as blocks 404 and 406. The entries in the capacity map corresponding to the placement bins covered by the region of the first region constraint are bounded by a dashed line, and the entries in the capacity map corresponding to the placement bins covered by the region of the second region constraint are bounded by a dotted line. Entries 408 and 410 correspond to the placement bins in the overlapping area of the two regions.

The sets of entries in the capacity map that correspond to sub-regions of the two regions are shown by the areas covered by the different patterns of hash lines. For example, the area 412 covered by diagonal hash lines corresponds to one of the sub-regions. The capacity map can be stored as a data structure in a memory arrangement of a computer system.

The capacity compensation map can be similarly organized. In response to determining that a sub-region is over-utilized, the MFCC algorithm can equally distribute the computed amount of virtual capacity amongst the placement bins of the sub-region. The MFCC algorithm can output an updated capacity map in which the entries in the capacity map are summed with corresponding entries in the capacity compensation map.

Figures 5, 6:
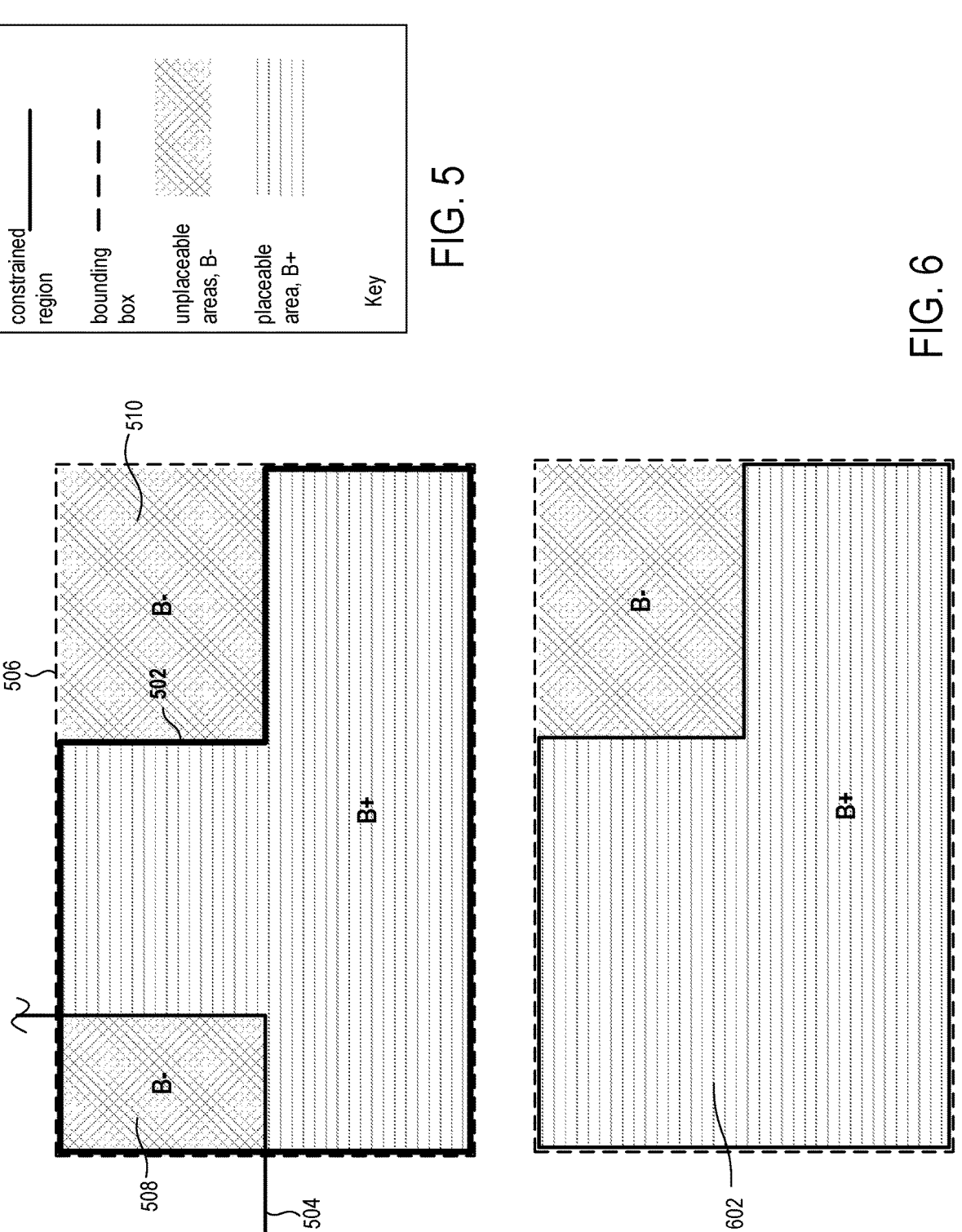
FIG. 5 shows an example of a bounding box of an inclusive region constraint.
FIG. 6 shows an example of a bounding box of an exclusive region constraint.
Figure 7:
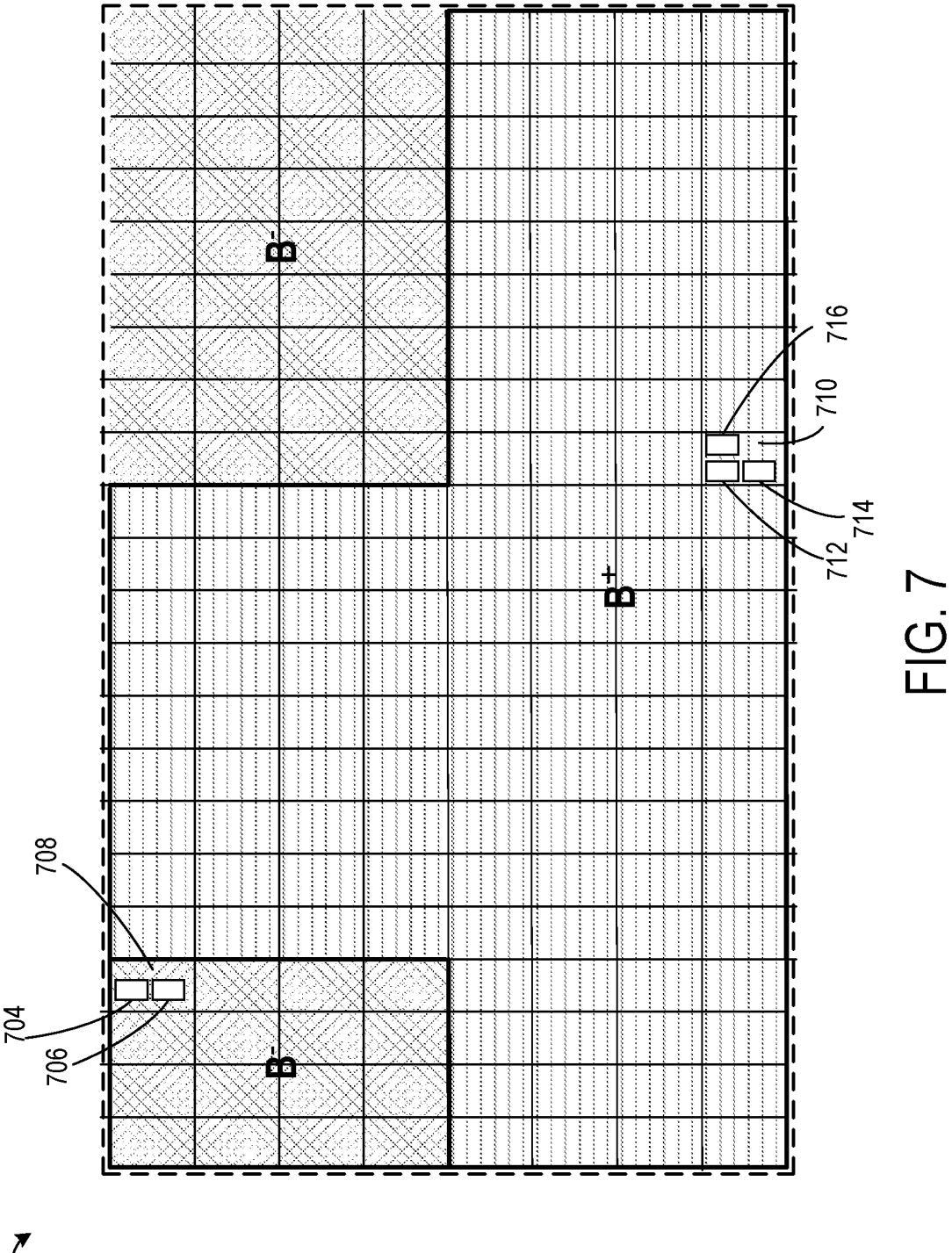
FIG. 7 shows an exemplary portion of a demand map corresponding to the example of FIG. 5.

According to the disclosed approaches, the design tool maintains a separate electrostatics-based placement system for each region constraint on the smallest bounding box encompassing the constituent rectilinear regions. Capacities in each of the electrostatics-based placement systems can be retrieved from the adjusted capacity map (C+ΔC). FIGS. 5, 6, and 7 illustrate building of the resource demand maps by the design tool under different scenarios.

FIG. 5 shows an example of a bounding box determined by the design tool from an inclusive region constraint and the different areas within the bounding box for which levels of resources in a demand map (e.g., FIG. 7) are adjusted. The perimeter of the region 502 defined by the inclusive region constraint is shown by the thicker solid lines, and a portion of the boundary of the region 504 defined by an overlapping exclusive region constraint is shown by the thinner solid lines.

A region defined by a region constraint (the "constrained region") need not be a rectangle, as exemplified by constrained region 502. The "bounding box" of a constrained region is the smallest rectangular area that bounds the constrained region. In the example, bounding box 506 is the bounding box of the constrained region 502, and the bounding box encompasses a portion 508 of the constrained region 504 and an area 510 outside the boundary of the constrained region 502.

For a given region constraint with its bounding box B, there are two types of areas, denoted $B^+$ and $B^-$, within the bounding box, and four types of levels of demand, denoted $d_{int}$, $d_{ext}$, $d_{filler}$, and $d_{blk}$. $B^+$ is a placeable area, and $B^-$ is an unplaceable area. The design tool determines a placeable area to be a portion(s) of the bounding box in which instances in the constrained region are eligible for placement, and an unplaceable area to be a portion(s) of the bounding box in which instances in the constrained region are ineligible for placement. The placeable area of the bounding box 506 is shown by horizontal hash lines, and the unplaceable areas are shown by cross-hash lines. In the example, the unplaceable area 508 is part of an exclusive region constraint that overlaps the constrained region 502.

The level of $d_{int}$ demand (internal demand) is the level of demand by instances in the region constraint placed in an area within the bounding box, and the level of $d_{ext}$ demand (external demand) is the level of demand by instances in another constrained region placed in an area within the bounding box.

The level of $d_{filler}$ demand is the level of demand by filler instances placed in an area within the bounding box. The total of $d_{filler}$ demand is added by the design tool to equalize the total level of demand with the adjusted level of capacity according to a target level of utilization. For a given instance type, the total level of $d_{filler}$ demand added to the demand map by the design tool is $t*C-D$, where t is the target utilization, C is the total adjusted capacity of the target IC, and D is the total demand for resources by the circuit design. The total $d_{filler}$ demand can be modeled as filler instances assigned to placement bins of the demand map. The filler instances are not actual instances in the circuit design and have no connections to any instances in the circuit design. The filler instances are placed only for purposes of affecting placement of the actual instances in the circuit design, which are connected to other actual instances in the circuit design. In the initial iteration of determining the gradient descent, the placement of the filler instances can be heuristically determined or evenly distributed across the demand map. The level of $d_{filler}$ demand in an area, such as a bin, within the bounding box is the level of demand by the filler instances placed in that area.

The level of $d_{blk}$ demand is added by the design tool to repel instances being placed in $B^-$ areas. The $d_{blk}$ demand adds virtual demand ("virtual blockage demand") in unplacable areas in order to repel the actual instances away from those areas. The level of $d_{blk}$ demand in an area (e.g., a bin in a $B^-$ area) within a bounding box is $t*C_b$, where $C_b$ is the capacity in the area resulting from processing of the MFCC algorithm. Note that entries in the demand map in which no internal instances have been placed have a demand of $d_{blk}$.

All demands in a given area should be visible to all inclusive region constraints that cover it in order to ensure global equilibrium. Therefore, all $d_{int}$, $d_{ext}$, and $d_{filler}$ levels of demand are considered in placeable regions in inclusive regions constraints. However, for exclusive region constraints, demands from other region constraints ($d_{ext}$) are not considered, because the convergence of an exclusive region constraint should be independent of the placement of external instances. In unplaceable regions, regardless of inclusive or exclusive region constraints, only $d_{int}$ and extra virtual blockage demand $d_{blk}$ are considered to repel instances away from these areas.

The resulting level of demand in a placeable area (denoted $d^+$) of the bounding box of the constrained region of an inclusive region constraint is $d^+=d_{int}+d_{ext}+d_{filler}$. The resulting level of demand in a placeable area of the bounding box of the constrained region of an exclusive region constraint is $d^+=d_{int}+d_{filler}$. The resulting level of demand in an unplaceable area (denoted $d^-$) of the bounding box of any constrained region is $d^-=d_{int}+d_{blk}$.

FIG. 6 shows an example of a bounding box determined by the design tool from an exclusive region constraint and the placeable and unplaceable areas within the bounding box. As explained above, the resulting level of demand in a placeable area 602 of the bounding box of the constrained region of an exclusive region constraint is $d^+=d_{int}+d_{filler}$, because only instances in the exclusive region constraint can be placed in the constrained region.

FIG. 7 shows an exemplary portion 702 of a demand map corresponding to the example of FIG. 5. Similar to the capacity map (FIG. 4), the demand map has entries that correspond to placement bins of the target IC. Each entry in the demand map indicates the level demand ("tracked level of demand") for resources of the placement bin by instances placed in the bin. The design tool updates the tracked levels of demand in entries of the demand map based on current placements. To handle multiple types of instances, each entry in the demand map can have multiple values corresponding to the types of instances. Alternatively, separate demand maps can be maintained for the different types of instances.

The types of demand are shown as blocks within entries in the map. For example, blocks 704 and 706 exemplify the internal demand by instances in the exclusive region constraint 504 (FIG. 5) and the blockage level demand in the placement bin corresponding to entry 708.

As explained above, the level of demand in an unplaceable area is $d^-=d_{int}+d_{blk}$. The level of demand in a placement bin of an unplaceable area is $d^-_{bin}=d_{int\_bin}+d_{blk\_bin}$, where $d_{int\_bin}$ is the level of demand by instances placed in the associated placement bin, and $d_{blk\_bin}$ is $t*C_{bin}$, where t is the target utilization and $C_{bin}$ is the capacity of the placement bin indicated by the adjusted capacity map. Note that $d_{int\_bin}$ of a bin in an unplaceable area is based on instances in a region constraint other than the region constraint from which the bounding box is determined.

Examples of levels of demand of the three different types in a placement bin in a placeable area are shown as blocks 712, 714, and 716 in the entry 710. As explained above, the level of demand in a placeable area of the bounding box of the constrained region of an inclusive region constraint is $d^+=d_{int}+d_{ext}+d_{filler}$. The level of demand in the placement bin corresponding to entry 710 is $d^+_{bin}=d_{int\_bin}+d_{ext\_bin}+d_{filler\_bin}$. $d_{int\_bin}$ is the level of demand by instances in the region constraint placed in the associated placement bin, $d_{ext\_bin}$ is the level of demand by instances in another region constraint placed in the associated placement bin, and $d_{filler\_bin}$ is the level of demand by filler instances placed in the corresponding placement bin.

Figure 8:
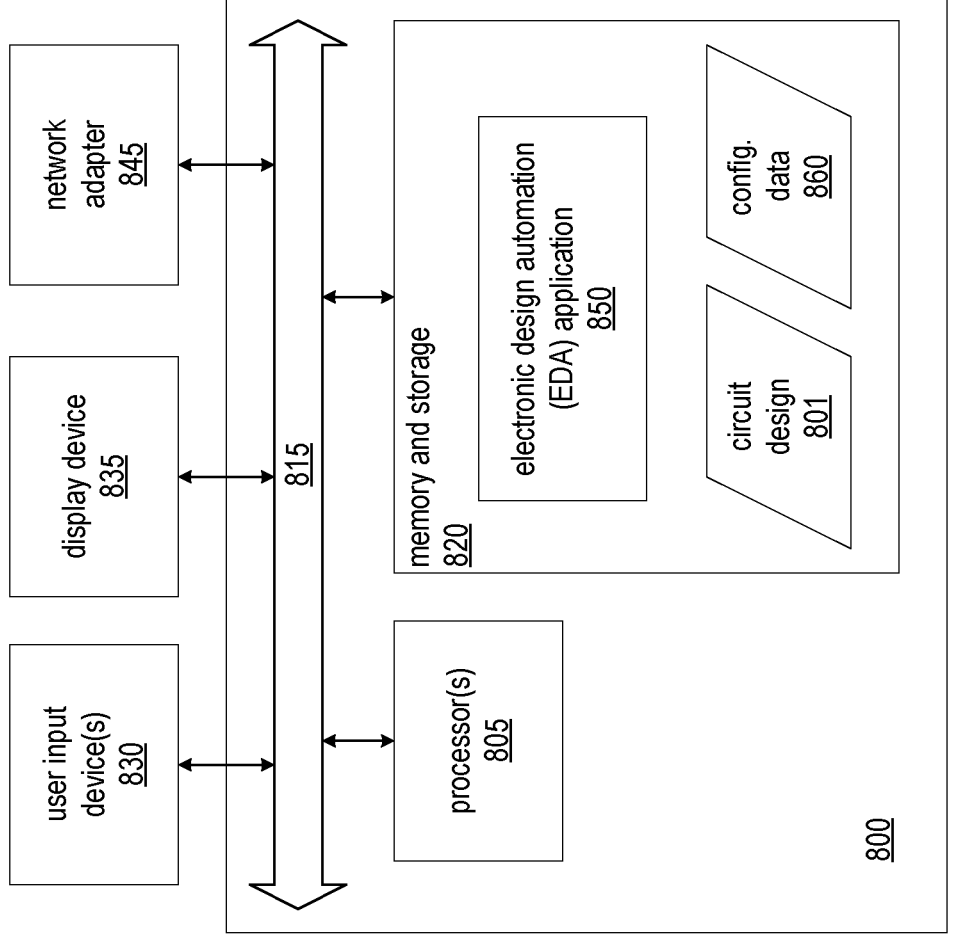
FIG. 8 is a block diagram illustrating an exemplary data processing system.

FIG. 8 is a block diagram illustrating an exemplary data processing system (system) 800. System 800 is an example of an electronic design automation (EDA) system. As pictured, system 800 includes at least one processor circuit (or "processor"), e.g., a central processing unit (CPU) 805 coupled to memory and storage arrangement 820 through a system bus 815 or other suitable circuitry. System 800 stores program code and circuit design 801 within memory and storage arrangement 820. Processor 805 executes the program code accessed from the memory and storage arrangement 820 via system bus 815. In one aspect, system 800 is implemented as a computer or other data processing system that is suitable for storing and/or executing program code. It should be appreciated, however, that system 800 can be implemented in the form of any system including a processor and memory that is capable of performing the functions described within this disclosure.

Memory and storage arrangement 820 includes one or more physical memory devices such as, for example, a local memory (not shown) and a persistent storage device (not shown). Local memory refers to random access memory or other non-persistent memory device(s) generally used during actual execution of the program code. Persistent storage can be implemented as a hard disk drive (HDD), a solid state drive (SSD), or other persistent data storage device. System 800 may also include one or more cache memories (not shown) that provide temporary storage of at least some program code and data in order to reduce the number of times program code and data must be retrieved from local memory and persistent storage during execution.

Input/output (I/O) devices such as user input device(s) 830 and a display device 835 may be optionally coupled to system 800. The I/O devices may be coupled to system 800 either directly or through intervening I/O controllers. A network adapter 845 also can be coupled to system 800 in order to couple system 800 to other systems, computer systems, remote printers, and/or remote storage devices through intervening private or public networks. Modems, cable modems, Ethernet cards, and wireless transceivers are examples of different types of network adapter 845 that can be used with system 800.

Memory and storage arrangement 820 may store an EDA application 850. EDA application 850, being implemented in the form of executable program code, is executed by processor(s) 805. As such, EDA application 850 is considered part of system 800. System 800, which is configured as a design tool while executing EDA application 850, receives and operates on circuit design 801. In one aspect, system 800 performs a design flow on circuit design 801, and the design flow may include synthesis, mapping, placement, routing, and generation of configuration data 801 from which a integrated circuit can be made.

EDA application 850, circuit design 801, circuit design 860, and any data items used, generated, and/or operated upon by EDA application 850 are functional data structures that impart functionality when employed as part of system 800 or when such elements, including derivations and/or modifications thereof, are loaded into an IC such as a programmable IC causing implementation and/or configuration of a circuit design within the programmable IC.

Though aspects and features may in some cases be described in individual figures, it will be appreciated that features from one figure can be combined with features of another figure even though the combination is not explicitly shown or explicitly described as a combination.

The methods and system are thought to be applicable to a variety of systems for that place circuit designs. Other aspects and features will be apparent to those skilled in the art from consideration of the specification. The methods and system or parts thereof may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A method comprising:

adjusting indicated capacity levels for placement bins associated with a target integrated circuit (IC) by a design tool, based on first levels of demand for resources by instances in a circuit design in regions of the target IC, wherein the regions are specified in the circuit design by a plurality of region constraints that restrict placement of the instances in the regions, and the regions including two or more overlapping regions;

adjusting tracked levels of demand for resources in the placement bins by the design tool, after adjusting the indicated capacity levels, based on the indicated capacity levels, a target utilization level of the resources in the placement bins, and a current placement of the instances in the placement bins;

updating the current placement of the instances by the design tool based on a density gradient of an electrostatics-based model of the tracked levels of demand; and repeating adjusting the tracked levels of demand and updating the current placement in response to the density gradient failing to satisfy a threshold.

2. The method of claim 1, wherein adjusting the indicated capacity levels includes adding a virtual capacity level to the indicated capacity levels in response to an actual utilization level exceeding the target utilization level.

3. The method of claim 2, wherein adjusting the indicated capacity levels includes:

identifying rectangular sub-regions formed by rectilinear corners of the plurality of region constraints;

preparing a bipartite graph having:

a source vertex, a first plurality of vertices representing the plurality of region constraints, respectively, a second plurality of vertices representing the sub-regions, respectively, a sink vertex, a plurality of first edges connecting the source vertex to the first plurality of vertices, respectively, wherein the first edges have edge capacities that indicate the first levels of demand, a plurality of second edges that connect the second plurality of vertices to the sink vertex, respectively, wherein the second edges have edge capacities that indicate capacity levels of the sub-regions, and a plurality of third edges that connect the first plurality of vertices to the second plurality of vertices, wherein each edge of the third edges indicates that a region constraint of the plurality of region constraints has an instance that is eligible for placement in a sub-region of the rectangular sub-regions; and determining an amount to increase the indicated capacity levels based on a maximum flow through the bipartite graph.

4. The method of claim 3, wherein:

the instances in the circuit design include first type instances and second type instances; and adjusting the indicated capacity levels includes:

preparing a first bipartite graph for determining an amount to increase the indicated capacity levels of the first type instances in the placement bins, and preparing a second first bipartite graph for determining an amount to increase the indicated capacity levels of the second type instances in the placement bins.

5. The method of claim 1, wherein adjusting the indicated capacity levels includes for each set of two or more overlapping region constraints of the plurality of region constraints:

identifying rectangular sub-regions formed by rectilinear corners of the plurality of region constraints; and determining virtual capacity levels to add to the indicated capacity levels to make global equilibrium of the electrostatics-based model achievable, based on capacity levels of the sub-regions and the first levels of demand.

6. The method of claim 5, wherein:

a capacity map has entries that correspond to the placement bins, respectively, and the entries store the indicated capacity levels;

determining the virtual capacity levels includes determining virtual capacity levels for the sub-regions, respectively; and adjusting the indicated capacity levels includes distributing a virtual capacity level of the virtual capacity levels amongst the entries in the capacity map that correspond to ones of the placement bins covered by the respective sub-region.

7. The method of claim 1, wherein adjusting the tracked levels of demand includes:

determining a total demand adjustment as $t*C-D$, wherein t is the target utilization level, C is a total of the indicated capacity levels, and D is a total of the first levels of demand;

creating a number of filler instances based on the total demand adjustment and placing the filler instances in the placement bins; and adjusting the tracked levels of demand for the resources in the placement bins, based on the indicated capacity levels, the target utilization level, and a current placement of the instances and the filler instances in the placement bins.

8. The method of claim 7, wherein:

a demand map has entries that correspond to and indicate for the placement bins, levels of demand by the current placement of the instances and the filler instances in the placement bins, respectively; and adjusting the tracked levels of demand includes updating the entries in the demand map.

9. The method of claim 8 wherein adjusting the tracked levels of demand includes:

determining for each region constraint, a bounding box that encompasses a region defined by the region constraint;

determining a placeable area within the bounding box, wherein the placeable area is a portion of the bounding box that allows placement of one or more instances specified by the region constraint and one or more of the filler instances; and adjusting a tracked level of demand in an entry in the demand map corresponding to a placement bin in response to the placement bin being within the placeable area, and based on placement of the one or more instances specified by the region constraint and placement of the one or more of the filler instances in the placement bin.

10. The method of claim 9, wherein adjusting the tracked levels of demand includes:

determining a level of virtual blockage demand based on the target utilization level and an indicated capacity level of a placement bin;

determining an unplaceable area within the bounding box, wherein the unplaceable area is a portion of the bounding box in which only instances of the region constraint are eligible for placement; and adjusting a tracked level of demand in an entry in the demand map corresponding to a placement bin within the unplaceable area based on placement of the one or more instances specified by the region constraint in the placement bin and the level of virtual blockage.

11. The method of claim 1, further comprising:

generating configuration data that implements the circuit design; and configuring a programmable IC with the configuration data to implement the circuit design on the programmable IC.

12. A system comprising:

one or more computer processors configured to execute program code; and a memory arrangement coupled to the one or more computer processors, wherein the memory arrangement is configured with instructions of a design tool that when executed by the one or more computer processors cause the one or more computer processors to perform operations including:

adjusting indicated capacity levels for placement bins associated with a target integrated circuit (IC), based on first levels of demand for resources by instances in a circuit design in regions of the target IC, wherein the regions are specified in the circuit design by a plurality of region constraints that restrict placement of the instances in the regions, and the regions including two or more overlapping regions;

adjusting tracked levels of demand for resources in the placement bins, after adjusting the indicated capacity levels, based on the indicated capacity levels, a target utilization level of the resources in the placement bins, and a current placement of the instances in the placement bins;

updating the current placement of the instances based on a density gradient of an electrostatics-based model of the tracked levels of demand; and repeating adjusting the tracked levels of demand and updating the current placement in response to the density gradient failing to satisfy a threshold.

13. The system of claim 12, wherein the instructions for adjusting the indicated capacity levels include instructions for adding a virtual capacity level to the indicated capacity levels in response to an actual utilization level exceeding the target utilization level.

14. The system of claim 13, wherein the instructions for adjusting the indicated capacity levels include instructions for:

identifying rectangular sub-regions formed by rectilinear corners of the plurality of region constraints;

preparing a bipartite graph having:

a source vertex, a first plurality of vertices representing the plurality of region constraints, respectively, a second plurality of vertices representing the sub-regions, respectively, a sink vertex, a plurality of first edges connecting the source vertex to the first plurality of vertices, respectively, wherein the first edges have edge capacities that indicate the first levels of demand, a plurality of second edges that connect the second plurality of vertices to the sink vertex, respectively, wherein the second edges have edge capacities that indicate capacity levels of the sub-regions, and a plurality of third edges that connect the first plurality of vertices to the second plurality of vertices, wherein each edge of the third edges indicates that a region constraint of the plurality of region constraints has an instance that is eligible for placement in a sub-region of the rectangular sub-regions; and determining an amount to increase the indicated capacity levels based on a maximum flow through the bipartite graph.

15. The system of claim 14, wherein:

the instances in the circuit design include first type instances and second type instances; and the instructions for adjusting the indicated capacity levels include instructions for:

preparing a first bipartite graph for determining an amount to increase the indicated capacity levels of the first type instances in the placement bins, and preparing a second first bipartite graph for determining an amount to increase the indicated capacity levels of the second type instances in the placement bins.

16. The system of claim 12, wherein the instructions for adjusting the indicated capacity levels include, for each set of two or more overlapping region constraints of the plurality of region constraints, instructions for:

identifying rectangular sub-regions formed by rectilinear corners of the plurality of region constraints; and determining virtual capacity levels to add to the indicated capacity levels to make global equilibrium of the electrostatics-based model achievable, based on capacity levels of the sub-regions and the first levels of demand.

17. The system of claim 16, wherein:

a capacity map has entries that correspond to the placement bins, respectively, and the entries store the indicated capacity levels;

the instructions for determining the virtual capacity levels include instructions for determining virtual capacity levels for the sub-regions, respectively; and the instructions for adjusting the indicated capacity levels include instructions for distributing a virtual capacity level of the virtual capacity levels amongst the entries in the capacity map that correspond to ones of the placement bins covered by the respective sub-region.

18. The system of claim 12, wherein the instructions for adjusting the tracked levels of demand include instructions for:

determining a total demand adjustment as t\*C−D, wherein t is the target utilization level, C is a total of the indicated capacity levels, and D is a total of the first levels of demand;

creating a number of filler instances based on the total demand adjustment and placing the filler instances in the placement bins; and adjusting the tracked levels of demand for the resources in the placement bins, based on the indicated capacity levels, the target utilization level, and a current placement of the instances and the filler instances in the placement bins.

19. The system of claim 18, wherein:

a demand map has entries that correspond to and indicate for the placement bins, levels of demand by the current placement of the instances and filler instances in the placement bins, respectively; and the instructions for adjusting the tracked levels of demand include instructions for updating the entries in the demand map.

20. The system of claim 19 wherein the instructions for adjusting the tracked levels of demand include instructions for:

determining for each region constraint, a bounding box that encompasses a region defined by the region constraint;

determining a placeable area within the bounding box, wherein the placeable area is a portion of the bounding box that allows placement of one or more instances specified by the region constraint and one or more of the filler instances; and adjusting a tracked level of demand in an entry in the demand map corresponding to a placement bin in response to the placement bin being within the placeable area, and based on placement of the one or more instances specified by the region constraint and placement of the one or more of the filler instances in the placement bin.

\* \* \* \* \*